United States Patent [19]

Billet et al.

[11] 4,185,298
[45] Jan. 22, 1980

[54] PROCESS AND APPARATUS FOR THE AUTOMATIC INSPECTION OF PATTERNS

[75] Inventors: Gilles Billet, Virieu le Grand; Jean Blottiau, Velizy, both of France

[73] Assignee: Compagnie Industrielle des Telecommunications Cit-Alcatel S.A., Paris, France

[21] Appl. No.: 713,964

[22] Filed: Aug. 12, 1976

[30] Foreign Application Priority Data

Aug. 13, 1975 [FR] France .................................. 75 25234

[51] Int. Cl.$^2$ .............................................. H04N 7/18
[52] U.S. Cl. ................................. 358/106; 358/212; 356/390; 356/237; 250/224; 250/565; 235/92 QC; 235/92 CA
[58] Field of Search ................ 358/106, 107, 108, 212, 358/213; 356/163, 165, 166, 168, 169, 239, 240, 390, 237; 250/224, 560, 565; 235/92 QC, 92 CA

[56] References Cited

U.S. PATENT DOCUMENTS

| | | | |
|---|---|---|---|
| 3,339,076 | 8/1967 | Hilal | 356/168 |
| 4,006,296 | 2/1977 | Peterson | 358/106 |

OTHER PUBLICATIONS

A. C. Turits, Sense, Mark, and Count Video Defects, vol. 12, No. 6, 11-69, p. 795, IBM (T.D.B.).
G. Giedd, Defect Scanner, vol. 13, No. 5, 10-70, p. 1062, I.B.M. (T.D.B.).

*Primary Examiner*—Robert L. Griffin
*Assistant Examiner*—Edward L. Coles
*Attorney, Agent, or Firm*—Haseltine, Lake & Waters

[57] ABSTRACT

An object pattern to be inspected, such as a printed circuit board, and a reference pattern are scanned synchronously by respective cameras. The outputs of the cameras are compared and a fault signal is produced when the outputs do not coincide.

10 Claims, 9 Drawing Figures

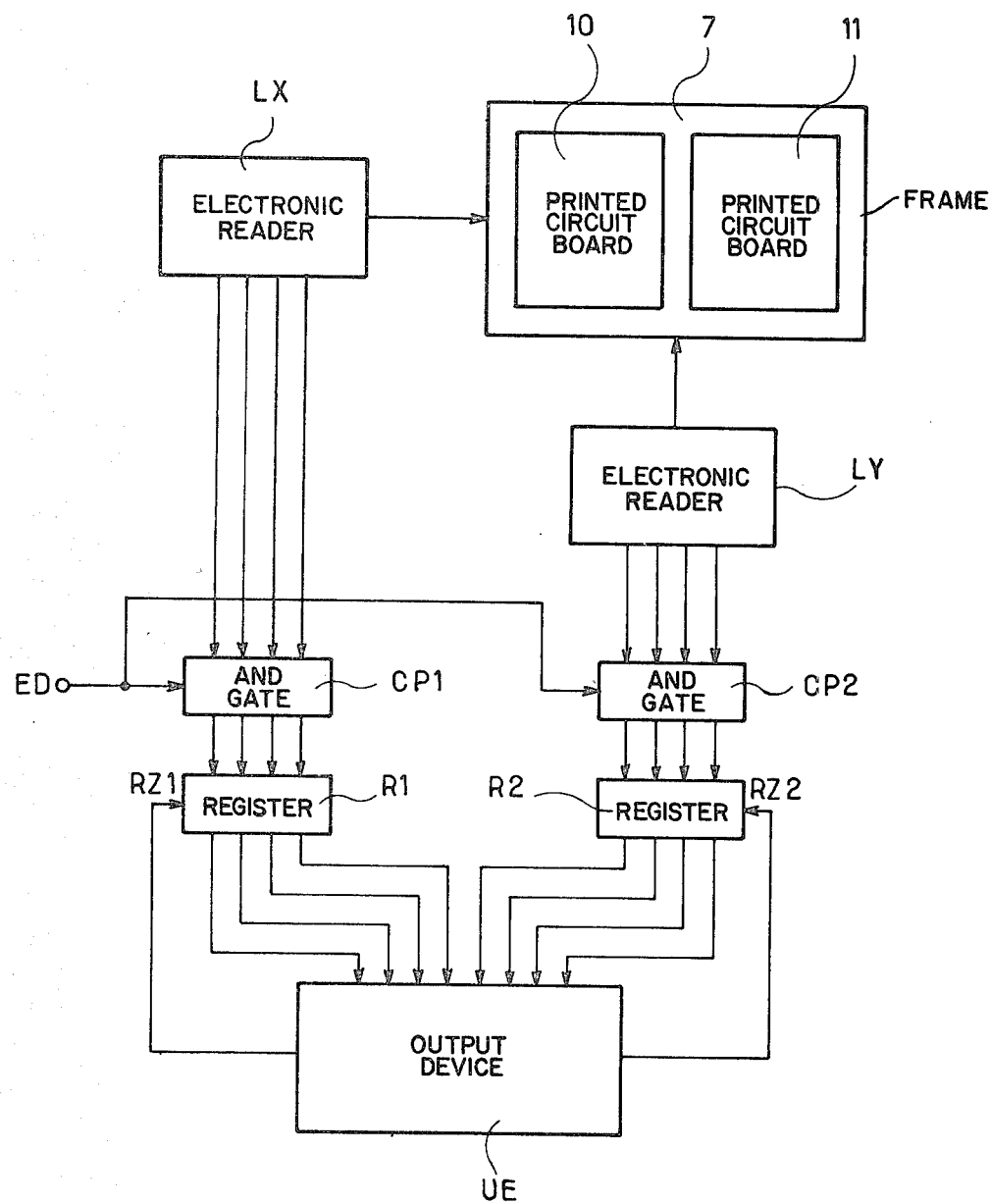

PROCESS AND APPARATUS FOR THE AUTOMATIC INSPECTION OF PATTERNS

FIELD OF THE INVENTION

The present invention relates to a process and apparatus for the automatic inspection of patterns, and in particular of patterns on printed circuit bords.

PRIOR ART

At the present, one process for inspection of printed circuit patterns employs visual examination equipement which includes a carriage for the inspected P.C. board, which carriage is manually shifted in a plane along x- and y- coordinates. A visualisation unit composed of a vertically positioned, diaphragmed projector and a horizontally positioned glazed screen overhangs the carriage, in such a way as to obtain an enlarged image of a part of the P.C. board on the screen.

There are also other means of optical inspection which employ the overlaying of one image on another, one obtained from a reference standard and the other from an inspected P.C. board, said overlaying being obtained by manual adjustment.

These manual visual inspection equipements and related processes are slow in application and involve substantial eye fatigue, the latter, in conjunction with the monotony of the work for the operator, favouring human error.

SUMMARY OF THE INVENTION

The present invention is directed to a process and equipement which are automatic, dispense with visual inspection, and detect faults in printed circuit patterns without risk of human error and at a rapid rate, said faults being located by the means of physical coordinates.

A characteristic of the process applied in the invention is the scanning, identical in time and space, of two printed circuit boards by two photodiode cameras, one of the boards carrying a standard reference printed circuit, and the other the printed circuit being inspected, both boards being translucent.

A characteristic of the apparatus of the invention is the fixed mounting of the cameras facing both said boards, which rest on a respective frame over a window, and the motion of the frame in x- and y- coordinates under the control of a driving mechanism.

A further characteristic of the invention is the provision of logic circuitry capable of processing analog output signals from both cameras, which vary according to the intensity of the light received as a function of the surface scanned: board material, printed circuit track, and holes. Said processing consists in converting the analog output signals into external digital data signals by comparison in parallel of the said analog camera output signals with a voltage threshold, effecting synchronised integration of the analog output signals and external and internal digital signals derived from both of the cameras, and, finally, comparing the logic status of the two types (internal and external) of the digital signals, in such a way as to trigger the generation of a "fault" signal if said comparison shows a difference between the two.

Yet a further characteristic of invention is the provision of logic circuitry capable of detecting the position of the printed circuit board inspected and stating, in binary code, the motions of the frame mentioned above in relation to the center-line of the camera facing said board, said code being applied to gating circuits associated with binary registers, and said code being stored by these registers on the enabling of said gating circuits by a "fault" signal, and fed out to a printer.

BRIEF DESCRIPTION OF THE DRAWINGS

An embodiment of the invention is described in detail, by way of example with reference to the accompanying drawings in which:

FIG. 7 is a diagram of a logic circuit for permitting the location of a fault in a printed circuit board pattern by generating the plane coordinates of its position.

DETAILED DESCRIPTION

Figure 1:
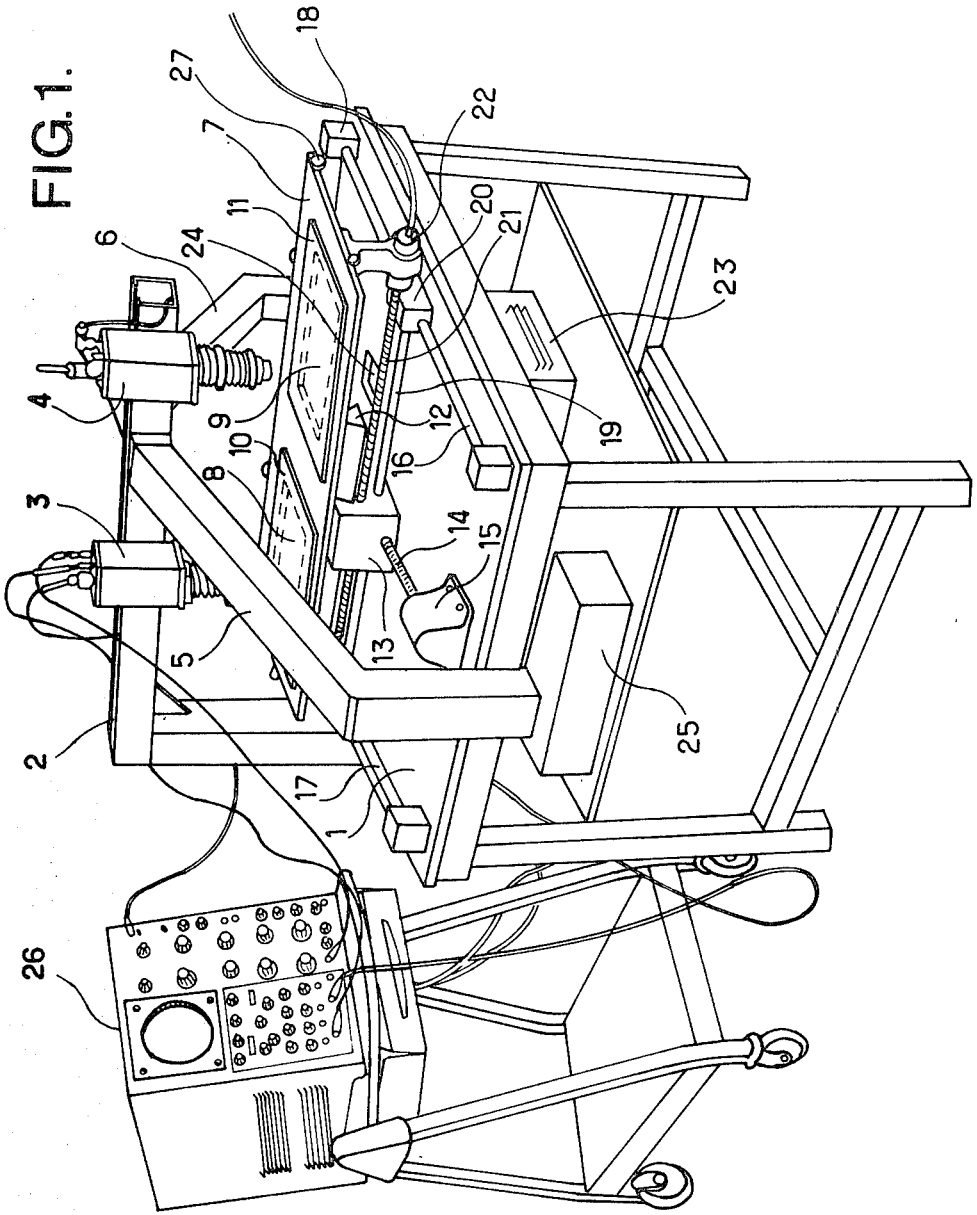
FIG. 1 is a perspective view of apparatus according to the invention.

The apparatus according to the invention as represented in FIG. 1 comprises a bench 1 surmounted by a structure 2 on which are mounted cameras 3 and 4 in parallel vertical planes, said structure being rendered rigid by struts 5 and 6. The bench carries a frame 7, in which two openings ("windows") 8 and 9 are provided each of said openings being covered by a corresponding printed circuit board 10 and 11, the areas of each opening or window being equal or more than that containing the printed circuits on each board.

The frame 7 is fixed to sliding carriage 12 free to move in a block 13.

Rotation of a worm-screw 14 driven by a constant-speed electricmotor 15 produces longitudinal motion of the frame 7 and the block 13, which is threaded to mate with worm-screw 14. Two smooth guide-rods 16 and 17 on either side of worm-screw 14 and parallel with it, are rigidly held in blocks such as 18.

A smooth rod 19 supports the assembly 13,12, 7 and is rigidly held in block 13, normal to worm-screw 14.

At each end, rod 19 is fixed to a bearing such as 20, said bearing being free to slide along a guide-rod such as 16 or 17.

Block 13 is also crossed by a worm-screw 21 mating with a corresponding thread in 13 and normal to worm-screw 14. A step-by-step electric motor 22 is fixed to one end of worm-screw 21 and attached rigidly to frame 7.

Each printed circuit board is illuminated by electric lamps housed in a container 23 and passing through two openings such as 24, in the bench 1 and opposite and below the two printed circuit boards.

The bench is also equipped with a recording device 25 such as a printer which records the positional coordinates of any faults detected by the system.

An oscilloscope 26 associated with the bench displays the signals resulting from scanning of the printed circuit boards and the "fault" signals.

The printed circuit boards are placed on frosted glass plates, not shown in the figure and which carry centering studs entering holes specifically provided at the edges of the printed circuit boards.

Adjustment of the positions of the printed circuit boards brings the camera 3 and 4 over precisely corresponding areas in each printed circuit board. Positional adjustement is made by means of manually rotated knurled knobs such as 27 and fine thread screws rotated by turning said knobs, to which they are rigidly fixed. Adjustment is checked by observing the analog signals emitted by cameras 3 and 4, and displayed on the screen of oscilloscope 26, correct adjustment being shown by the coincidence in coordinates of the two signals.

The principle of inspection of the pattern according to the invention is the detection by optical-electronic detectors in the focal plane of cameras designed for this purpose, of differing light intensities from the reflecting light of the printed circuit boards of their transmitting light, if the printed circuit boards are translucent (i.e. of expoxy glass, for example).

Said detectors can detect three distinct levels of intensity, according to whether the objective of the camera is "looking" at the metal of the printed circuit, the board material, or a hole in the printed circuit board.

The detectors used in the cameras of the apparatus according to the invention are strips of photodiodes in integrated circuit form, said strips being currently available commercially and consisting of 16, 64, 128, 256, or 1024 aligned photodiodes, each photodiode having a surface area of 25×25 microns.

The two cameras 3 and 4 are situated respectively over a standard reference printed circuit board, and an inspected P.C.B., so that their two photodiode strips are exposed at each instant to light coming from two corresponding areas each in a printed circuit board.

The photodiodes are "read" at a high frequency (1 MHz), this giving analog signals of amplitudes and wave-lengths related respectively to the light diffused by the printed circuit board, and to the pattern on said P.C.B.

If A (FIG. 2) identifies a portion of a standard reference printed circuit board and B the corresponding portion of an inspected printed circuit board, the aligned photodiodes of the first camera facing A along axis w-z will generate analog signals VDA, while the aligned photodiodes of the other camera facing B along the same axis will generate analog signals VDB.

Figure 2:
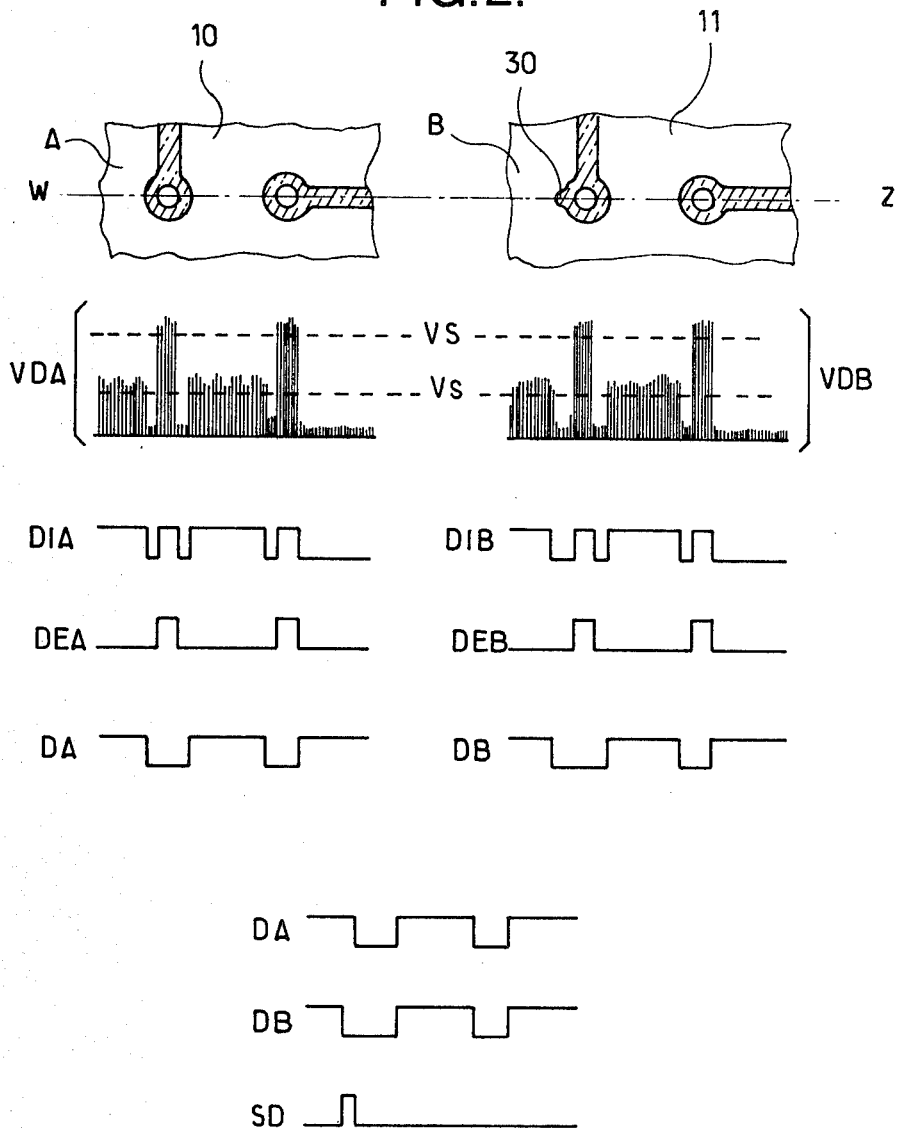
FIG. 2 is a phase diagram both of the analog and digital signals resulting from the synchronised scanning of a part of the standard reference printed circuit board, and the corresponding part of the inspected printed circuit board and of the "fault" signal generated on appearance of a difference between said sets of signals.

In FIG. 2 the tracks and pads of the printed circuits in portions A and B are shown shaded, the holes in the islands are shown black, and the base material of the board is shown white. The amplitude of analog signals produced by diffusion through the base material of the light is slightly greater than a minimum voltage threshold Vs, whereas that of the analog signals generated by the photodiodes in response to the light passing through the holes, is slightly greater than a maximum voltage threshold Vs. The blocking of the light by the metal of the circuits produces an absence of analog signals (intervals between analog signals of different amplitudes).

Portion B exhibits a pattern fault in the form of a "bump" 30 on the outer edge of a printed circuit pad. This fault causes a wider interval between analog signals VDB, than between the corresponding signals VDA.

Analog signals VDA and VDB produced in cameras CMA, CMB (FIG. 3) are fed respectively to voltage comparators CIA and CIB, included in said cameras. Said signals are compared by the comparators with the minimum voltage threshold Vs and converted at the output into digital data signals, referred to as "internal data" DIA and DIB and shown in the phase diagrams of FIG. 2. The same analog signals VDA and VDB are also fed to voltage comparators C2A and C2B, which are part of logic circuitry external to the cameras. Said analog signals are compared by these comparators with the maximum threshold voltage Vs, and converted at the output into digital data signals referred to as "external data" DEA and DEB and also appearing in the phase diagrams in FIG. 2.

Gates PA and PB have outputs DA and DB connected to inputs of exclusive OR gate PD, whose output SD delivers a "fault" signal such as the signal represented in the phase diagram as SD (FIG. 2), if its input signals DA and DB are not in agreement.

The photodiodes of a strip are read in series cyclically, by the logic of each camera. As the corresponding photodiodes in each strip must be read simultaneously, the synchronous reading frequency of the photodiode strips is that of a read enable signal VAL derived from a clock signal by a counter, and of a pulse length at least equal to the period of the clock, multiplied by the number of photodiodes per strip. As each camera has its own internal logic and as the cameras are not designed to work together in absolute synchronism, they are externally synchronised. For this, the enable signal VAL is obtained by electronic counting of the number of photodiodes per strip, from a clock signal produced by a "master" camera and imposed on the other.

Scanning of the surface of each printed circuit board by the photodiode strip of each camera is ensured by crossed motions of the printed circuit board holder frame, as defined in the following:

electric motor 15, which moves the frame in the longitudinal direction, runs at constant speed, and reverses its direction of rotation at end-of-travel in each direction of frame, after the latter has been shifted laterally over a distance at most equal to the length of the strip, which ensures the overlapping of the scanned zones.

Lateral shift is imparted by step-by-step electric motor 22.

Electric motor control switching is effected by limit detectors not shown in FIG. 1.

Figure 4:
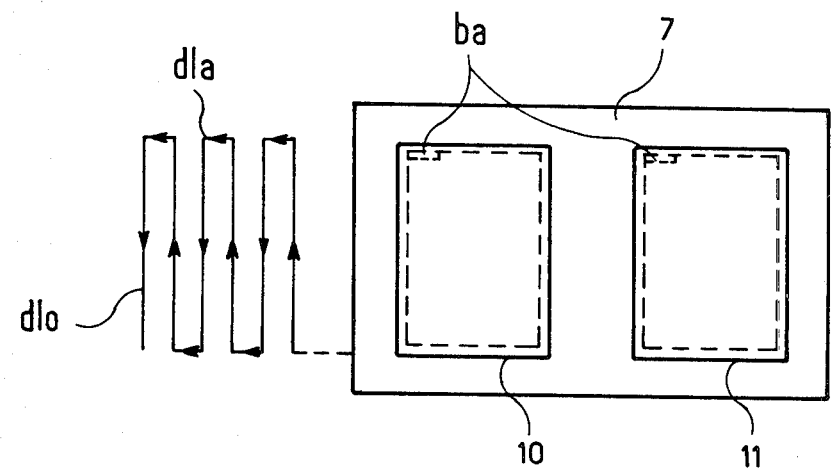
FIG. 4 shows the motions of a frame carrying the two printed circuit boards and the areas in each scanned by camera photodiode strips.

FIG. 4 is a diagram of longitudinal motions dlo and lateral shift dla of frame 7, which permit scanning of the entire surface of printed circuit boards 10 and 11 by photodiode strips ba. The length of lateral shift dla is slightly shorter than of a photodiode strip, and the length of longitudinal travel dlo is that of the side of the printed circuit board which is normal to the long side of the said photodiode strip. Printed circuit boards 10 and 11 are placed on frame 7 so that their long sides are parallel, and their short sides are in alignment. The photodiodes strips of the cameras are situated so that their respective long sides lie exactly on the same line.

As the photodiodes are read at the clock frequency (1 MHz, for example) in continuous cycles, and as the frame travels longitudinally at constant speed, successive photodiode reading takes place every microsecond. If it is assumed that the strip contains 16 photodiodes, the periodic reading of the same photodiode will take place once every 16 microseconds, which is the time during which the capacitance of the photodiode will become charged as a function of its illumination by the band of basic printed circuit board area scanned by that photodiode during one complete cycle.

More generally stated, periodic reading of the same photodiode takes place at theoretically minimum intervals $T = t \times n$, in which t is the reading time of a photodiode, and n the number of photodiodes in a strip. Assuming that the printed circuit board travels in front of the strip at a theoretically constant speed Vth, the successive basic zones ze scanned during the reading in series of the photodiodes are shifted between each reading by distance d travelled by the printed circuit board, the printed circuit board travelling the distance D between each two successive readings of the same photodiode (FIG. 5a).

h is the height of a basic zone such as ze scanned by each photodiode at a given instant of reading, H is the height of the zone scanned during a reading cycle, K is the width of the zone scanned by the photodiode strip.

It will be noted that at the printed circuit board travel rate Vth, there is a loss of data in the area shown shaded and indicating a band of the zone that has remained unscanned, because the corresponding photodiode was not read during this interval.

Figure 5:
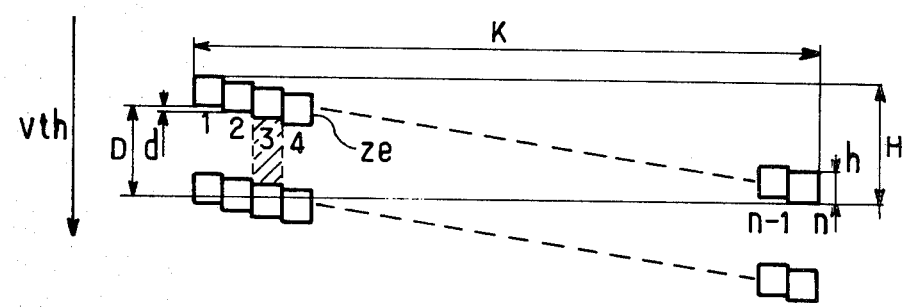
FIGS. 5a and 5b show the detail of the scanning of a printed circuit board zone and the gapless juxtaposition of the elementary areas explored by the photodiodes as a function of optimal speed of longitudinal motion of a printed circuit board, and the cyclic "reading" of the cells of the photodiode strip.
Figure 5:
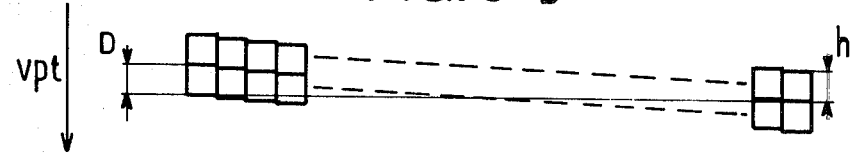

To ensure total coverage of the printed circuit board, it is necessary for $D = h$, and consequently to employ a practical rate of travel Vpt of the printed circuit board such that $Vpt = (h/nt) = (h/T)$ Coverage of the basic zone is then gapless, as shown in FIG. 5b.

Figure 3:
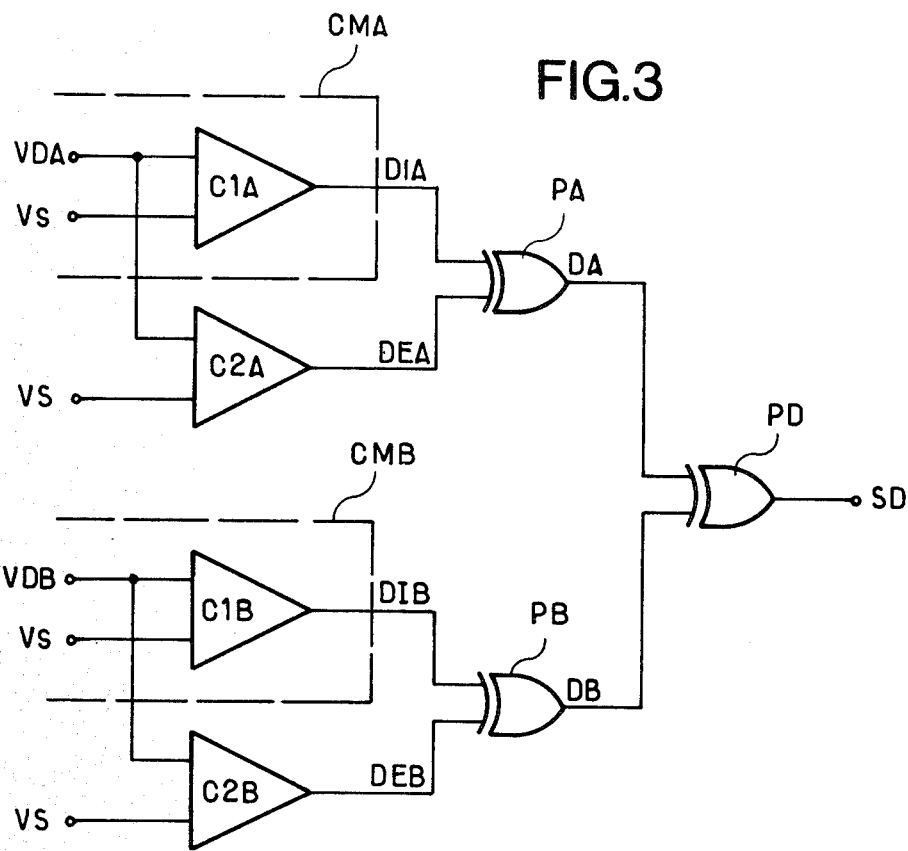
FIG. 3 is a logic circuit diagram showing the principles employed in comparing the signals represented in FIG. 2 and obtaining the "fault" signal.
Figure 6:
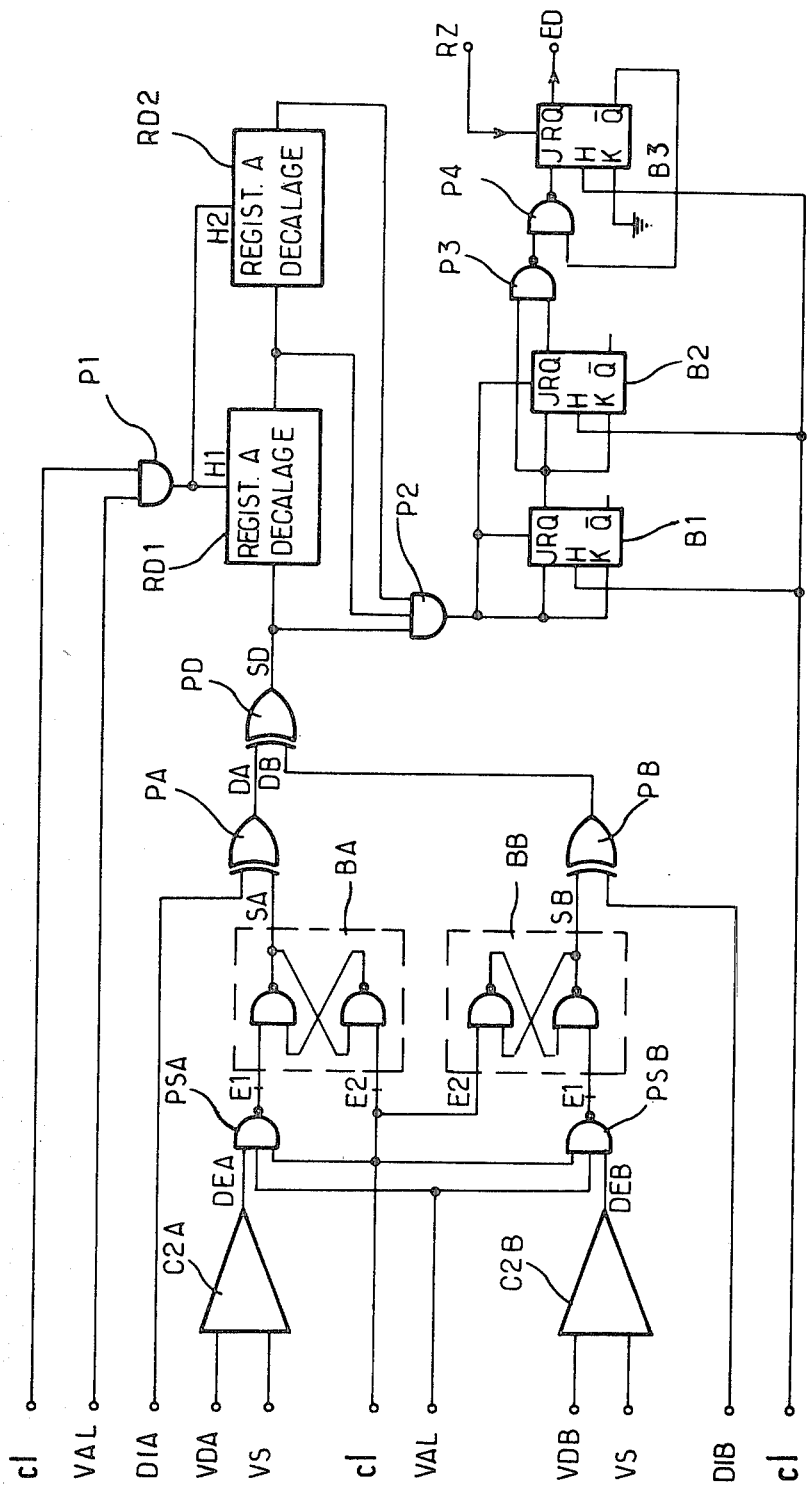
FIG. 6 is a diagram of a logic circuit for permitting synchronisation of a fault before generation of the "fault" signal.

FIG. 6 is a logic circuit diagram derived from the logic diagram in FIG. 3, and showing the circuits which generate the fault signal. In it we see again the comparators C2A and C2B, external to cameras CMA and CMB, which respectively compare the voltages of analog signals VDA and VDB from said cameras with a maximum threshold voltage VS.

The data external to camera CMA and appearing at output DEA of comparator C2A are presented at the input of exclusive-OR gate PXA through NAND gate PSA and flip-flop PA.

The data DIA internal to camera CMA are presented at the second input of exclusive OR gate PA, which is connected to one input DA of exclusive-OR gate PD.

The data external to camera CMB and appearing at output DEB of comparator C2B are presented at one input of exclusive-OR gate PB through NAND gate PSB and flip-flop BB. The data DIB internal to said camera CMB are presented at the second input of gate PB, of which output DB is connected to the second input of gate PD.

NAND gates PSA and PSB have three inputs; of these, the second of each gate is common to input VAL (gating or "enable" input), and the third of each is common to input C1, at which clock pulses appear. The binary 0's or 1's of DEA and DEB are thus delivered at the outputs of PSA and PSB as successive status pulses "0" and "1" at the clock frequency, said signals being inverted and shaped respectively at the outputs SA and SB respectively of flip-flops BA and BB.

Hence, in coincidence with each clock pulse, outputs SA and SB of flip-flops BA and BB, in synchronism, present a fraction of external data signals DEA and DEB respectively, locked for the period of the clock signal.

If, after having carried out the exclusive-OR operation during one clock pulse on the status of DIA and that of the fraction of DEA coinciding with the duration of that clock pulse, and the same operation on the status of DIB and the same fraction of DEB, gates PA and PB each present an identical output "0" or output "1", gate PD will present an output "0" stating the equivalence of the patterns in the two corresponding zones A and B of the printed circuit board scanned at that instant.

If gates PA and PB present a "1" and a "0" respectively, or vice-versa, gate PD will present a "1", which indicates disagreement between patterns in zones Z and B of the printed circuit boards, scanned at that instant.

During a first photodiode strip reading cycle, the signals presented at the output of gate PD are stored in a shift register RD1, and during a second reading cycle they are stored in a shift register RD2, said registers in series each having a bit storage capacity that is equal to the number of photodiodes in a strip.

The "0's" and "1's" indicating agreement or the reverse between scanned points of scanned patterns are fed into the registers at the clock rate C1 and gated by pulses VAL through AND gate P1 connected to the clock inputs H1 and H2 of said registers.

AND gate P2 is connected at the output SD of gate PD and the outputs of the two shift registers in series, so that said gate P2 will open only at the third "1" ("fault") from the same photodiode, i.e. at third successive reading of that photodiode.

The output of gate PD is presented to the inputs J,K of JK flip-flop B1 and to the "clear" inputs R of B1 and JK flip-flop B2. Output Q of B1 is connected to the J,K inputs of B2 and to one input of NAND gate P3, whose second input is connected to output Q of the second JK flip-flop B2. Output $\overline{Q}$ of the two flip-flops B1 and B2 are not used. The output of NAND gate P3 is connected to an input of two input NAND gate P4, which has its output connected to the J input of JK flip-flop B3, whose input K is grounded and output $\overline{Q}$ fed back to the second input of P4, whereas its output Q appears at the logic circuitry fault recording output ED.

Input C1 of the logic circuitry, to which clock pulses are presented, is connected to the clock inputs H of the JK flip-flop B1, B2, and B3.

In the absence of a "fault" signal, gate P2 presents an output "0" and locks flip-flop B1 and B2 at "0" through "clear" input R. Gate P3, of which both inputs are at "0", presents an output "1". Flip-flop B3 is set to "0" (Q="0") by a manual control presenting "0" at its "clear" input from "reset" input to the logic circuitry RZ. Output $\overline{Q}$="1" of B3 clamps gate P3 at "0" output, said flip-flop of which J and K are at "0", maintains Q="0" at the logic circuitry "fault" signal output ED.

At "1" appearing at the output of PD and indicating the presence of a fault must persist for more than the cumulative duration of two successive clock pulses to be effective: when the leading edge of the first increasing clock pulse following the appearance of "1" at inputs J and K of B1, the output Q of B1 goes to "1", as also do the J, K inputs of B2, whose output Q remains at "0". The inputs of P3 being respectively "1" and "0", the output of this gate remains at "1".

On the second clock pulse, the output Q of B1 goes to "1" as also do the J,K inputs of B2. The output Q of B2, and the output of P3 stay at "0".

On the third clock pulse, the output Q of B1 goes to "0", as also do the inputs J, K of B2 and its output Q. P3, whose both inputs are now "1's", to "0", and P4 therefore goes to "1".

Flip-flop B3, of which J="1" and K="0", presents "1" at output Q, thereby indicating the presence of a fault at output ED of the logic circuitry.

The output $\overline{Q}$ of B3 going to "0" confirms the "1" at the output of P4.

The output ED of the logic circuitry is connected to gates CP1 and CP2 shown in FIG. 7.

The lateral and longitudinal motions of frame 7 are read in x,y coordinates by electronic readers LX and LY, said readers transmitting said coordinates in binary to registers R1 and R2 respectively through AND gates CP1 and CP2 respectively, which are enabled by a fault signal appearing at ED.

Registers R1 and R2 store the "fault" coordinates relating to the inspected printed circuit board until recorded by the output device UE (teleprinter, mag-tape, etc.) UE resets the registers by presenting a signal at "clear" inputs RZ1 and RZ2 respectively.

The camera scanning the inspected printed circuit board can moreover be advantageously equipped to mark fault locations directly by depositing a small drop of ink on the printed circuit board in its immediate vicinity, said marking being triggered by the "fault" signal presented at output ED as described.

Figure 8:
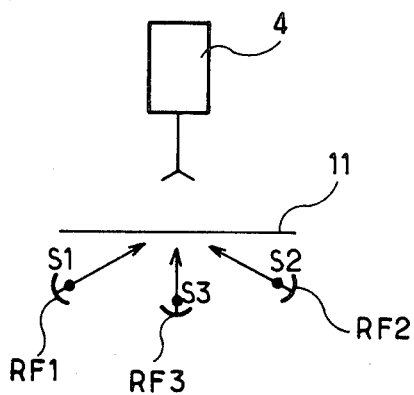
FIG. 8 is a drawing which shows the orientation towards a printed circuit board of light sources used to direct light through the printed circuit board.

Each translucent printed circuit board such as 11 (FIG. 8) is illuminated by 3 light sources, of which one, S3, are in the center-line of camera's objective such as 4, and two others, S1, S2, symmetrically situated on either side of said center-line.

Light reflectors RF1, RF2, RF3 cause convergence of light beams of their corresponding sources on the zone of the printed circuit board viewed by the camera. The intensity of the light emitted by S3, whose beam is perpendicular to the printed circuit board, is less than that of the beams emitted by S1 and S2, whose beams are oblique to the printed circuit board, thereby avoiding overloading the photodiodes by excessive direct illumination through holes in the printed circuit board.

In the example described, the cameras are fixed and the printed circuit board are placed on a mobile frame; a fixed printed circuit board holder frame and mobile cameras come within the scope of the invention.

What is claimed is:

1. A process for the automatic inspection of patterns on printed circuits boards comprising positioning two cameras (3,4) each facing a corresponding printed circuit board (10,11), illuminating the printed circuits on said boards, one of the boards carrying a standard reference printed circuit, and the other a printed circuit to be inspected, providing said cameras with a strip of photodiodes lying in a plane parallel to said printed circuit boards, and effecting a comparison between said standard reference printed circuit and the printed circuit to be inspected by simultaneously:

a. scanning corresponding areas of the printed circuits of each board by synchronized relative translation of either the cameras or the boards, said relative translation and said scanning of the strips of photodiodes being co-ordinated to cause each board to be entirely explored, b. effecting synchronized cyclic scanning of the photodiodes of said strips of photodiodes, and converting the analog signals delivered by the photodiodes into digital data and by comparing said digital data by a logic circuit providing a fault signal if comparison shows a difference between the boards, said analog signals derived from the cameras being converted into first digital data signals by comparison with a minimum voltage threshold, said first data signals corresponding to light being sensed by the photodiodes after passing through the boards or through holes in the boards, the absence of said first signals corresponding to the absence of light because of the printed circuit pattern, said analog signals which are produced by the sensed light passing through the holes being additionally converted into second digital data signals by comparison with a maximum voltage threshold.

2. A process according to claim 1 in which each of the said boards rests on a frame extending normal to the center-line of the scanning area of its respective camera so that the objectives of said cameras scan respectively, on each of said illuminated boards, a corresponding pattern area, said cameras being fixed and said frame being movable in two dimensions in its plane at a constant speed, said frame being laterally shifted at the end of a line of board scanning by a distance corresponding to the width of the area of the board sensed by the camera at any one instant.

3. A process according to claim 1 wherein the operation of producing the first and the second data signals of each camera is effected in first and second exclusive OR-circuits and data from the first and second exclusive-OR circuits is supplied to a third exclusive OR-circuit, so that the final resulting operation is a logic signal indicative of a difference or an identity between the pattern of a printed circuit area of the standard board and that of the corresponding area of the inspected board.

4. A process according to claim 3, in which the "fault" signal opens a pair of logic AND gates (CP1, CP2) the inputs of one of which are connected to a reader (LX) of the relative lateral positioning of the frame and the cameras and to a reader (LY) of the relative longitudinal positioning of said frame and the cameras, said circuits transmitting upon the "fault" signal the binary co-ordinates of the frame-camera to interface registers (R1,R2) of a registering unit (UE), said "fault" also being arranged to control a direct detection device to mark the pattern fault by depositing a small drop of ink in its immediate vicinity.

5. Apparatus for automatic inspection of patterns on printed circuit boards, said apparatus comprising a bench, a frame, means supporting said frame on said bench for displacement in the plane of the X and Y coordinates, said frame having two windows, a first board with a standard printed circuit thereon mounted on said frame at one of said windows, a second board with a printed circuit thereon to be inspected mounted on said frame at the other of said windows, two cameras equipped with a strip of photodiodes mounted on said bench, said cameras facing respective printed circuit boards for scanning corresponding areas of the printed circuits of each board, the displacement of said frame by the displacement means in the X-Y plane being coordinated with a cyclic scanning of the photodiodes of the strip to enable the cameras to scan synchronously the entire printed circuits on the boards, two light source means for illuminating said boards, and logic circuit means connected to said cameras for synchronously processing analog signals from the photodiodes thereof and for producing a logic signal when there is a fault in the printed circuit being inspected, said logic circuit means comprising means for converting the analog signals from the photodiodes of the cameras into first digital data signals by comparison with a minimum voltage threshold, said signals corresponding to light being sensed by the photodiodes after passing through the boards or through holes in the boards, the absence of said first signals corresponding to the absence of light because of the printed circuit pattern, means for converting those analog signals which are produced by passage of light through the holes into second digital data signals by comparison with a maximum voltage threshold, means for receiving the first and second digital data signals from each camera to produce a third digital data signal and means for comparing the third digital data signals from the two cameras to produce said logic signal indicative of a difference between said third signals signifying the presence of the fault in the printed circuit of the inspected board.

6. Apparatus according to claim 5 wherein the frame displacement means comprises a movable carriage shifted in the plane of the x, y co-ordinates, a slidable carriage (12) freely movable in a block (13), said block being longitudinally coupled to a worm-screw (14) driven by an electric motor (15) operated at a constant speed and inverted direction of rotation, said block being held during its travelling by a carrier-rod (19) laterally fixed to said block, said carrier-rod having free ends each supported by a bearing (20) free to slide along a guide-rod (16) having ends rigidly held in blocks (18), said block (13) being coupled to a worm-screw (21) extending parallel to said carrier-rod, a step-by-step electric motor 22 fixed to one end of said worm-screw and to said frame, and proximity indicator means for detecting the end of longitudinal travel of the frame in one direction or the other, so that, at the end of travel, the step-by-step electric motor produces lateral motion of said frame at a length equal to that of the scanning area of the camera.

7. Apparatus according to claim 5 in which each of the two light source means comprises three light sources, each board being disposed between the camera objective and the three light sources whose beams are directed to the area of the board normal to the center-line of the camera, two of said sources (S1, S2) being symmetrical to said center-line and the third source (S3) being of a weaker power and parallel with said center-line.

8. Apparatus according to claim 12 wherein each camera has an internal logic, one of said cameras imposing its clock pulse rate on the other by an electronic synchronization generating read enable signal (VAL) derived from a clock pulse by a counter corresponding to the number of photodiodes per strip of scanning area, said pulse being introduced in said cameras.

9. Apparatus according to claim 8 wherein said means for converting analog signals into second digital data signals comprises logic circuits having two voltage comparators (C2A, C2B) feeding respective analog signals from the cameras and converting them by comparison with the maximum voltage threshold into digital data signals (DEA,DEB) external to said cameras, said external digital signals being respectively presented at the first inputs E1 of a pair of bistable flip-flops (BA,BB) through a pair of NAND gates (PSA,PSB), said gates being active during each photodiode reading cycle, said clock pulse being connected in common to the input of said gates and to a second input (E2) of each flip-flop, so that external digital logic signals of said cameras are synchronized at the output of said flip-flops at the rhythm of said clock.

10. Apparatus according to claim 9 wherein the logic circuits are capable of producing a signal of a given logic status when there is a fault in the pattern, in which the outputs of a synchronization flip-flop of the external logic signals of each camera are each connected to said means which produces the third digital signal which comprises an "exclusive-OR" gate PA,PB, feeding internal signals DIA,DIB of the respective camera, the outputs of said gates being connected to the input of the means which produces said logic signal which comprises a third "exclusive OR" gate (PD) so that when the logic signals generated by the two first gates associated with the flip-flops are different, said third gate generates a given logic status signal showing a "pattern fault".

* * * * *